(12) United States Patent
Huang et al.

(10) Patent No.: US 9,391,574 B2
(45) Date of Patent: Jul. 12, 2016

(54) POWER SUPPLY REGULATION FOR PROGRAMMABLE GAIN AMPLIFIER USED IN A CMOS IMAGE SENSOR

(71) Applicants: Steven Huang, Pasadena, CA (US); Jack Zheng, Pasadena, CA (US)

(72) Inventors: Steven Huang, Pasadena, CA (US); Jack Zheng, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 401 days.

(21) Appl. No.: 13/752,848

(22) Filed: Jan. 29, 2013

(65) Prior Publication Data

US 2013/0321083 A1    Dec. 5, 2013

Related U.S. Application Data

(60) Provisional application No. 61/654,258, filed on Jun. 1, 2012.

(51) Int. Cl.
| | |
|---|---|
| *H03F 3/08* | (2006.01) |
| *H01L 27/00* | (2006.01) |
| *H01J 40/14* | (2006.01) |
| *H03G 3/00* | (2006.01) |
| *H03G 11/00* | (2006.01) |

(52) U.S. Cl.
CPC ............... *H03G 3/007* (2013.01); *H03G 11/00* (2013.01)

(58) Field of Classification Search
CPC . H04N 5/23241; H04N 5/37457; H04N 9/64; H03F 1/34; H04B 2210/003
USPC ............ 348/272–283, 294–324, 332, 333.08, 348/335–338; 330/282, 250, 252, 254, 255, 330/257, 278, 127, 129, 130, 131, 136; 250/208.1, 214 R, 214 A, 214.1; 257/291–294, 414, 431–466; 438/57, 438/65
See application file for complete search history.

(56) References Cited

U.S. PATENT DOCUMENTS

| | | | |
|---|---|---|---|
| 7,667,171 B2* | 2/2010 | Kasuga | H04N 3/155 250/208.1 |
| 2003/0133627 A1* | 7/2003 | Brehmer | H04N 5/243 382/308 |
| 2005/0023443 A1* | 2/2005 | Fujita | H03F 3/082 250/214 A |
| 2008/0024630 A1* | 1/2008 | Hiyama et al. | 348/241 |
| 2010/0188539 A1* | 7/2010 | Kobayashi | 348/300 |

* cited by examiner

*Primary Examiner* — Pascal M Bui Pho
(74) *Attorney, Agent, or Firm* — Law Office of Scott C Harris, Inc

(57) ABSTRACT

An image sensor array that has a plurality of image sensing pixels and a plurality of programmable gain amplifiers, each of the programmable gain amplifiers connected to receive and amplify an output of said image sensing pixels. Each of said programmable gain senses when an output of the programmable gain amplifier is in an oversaturated condition. Responsive to sensing that the output of the programmable gain amplifier in the oversaturated condition, the amplifier automatically clamps a bias amount to the programmable gain amplifier, to thereby regulate an amount of current draw of the programmable gain amplifier. In this way, the power supply current to that pixel which is oversaturated is prevented from affecting power supplies to the other pixels, by regulating the power supply to the oversaturated pixel.

3 Claims, 4 Drawing Sheets

POWER SUPPLY REGULATION FOR PROGRAMMABLE GAIN AMPLIFIER USED IN A CMOS IMAGE SENSOR

This application claims priority from Provisional application No. 61/654,258, filed Jun. 1, 2012, the entire contents of which are herewith incorporated by reference.

BACKGROUND

CMOS image sensors may have a column parallel readout using an array of programmable gain amplifiers or PGAs. The array of PGAs reads a row of pixels simultaneously and stores the results in Sample and Hold structures which are typically capacitors. Ideally, the signal being stored by a given column's PGA should be independent of any external conditions such as power or ground supply variation.

When the power supply does show variation, it can induce image artifacts known as "streaking" or "ghosting". A sample of such an image artifact is shown in FIG. 1. This kind of image artifact can occur when a certain number of PGAs are over saturated, and draw excess power to maintain. The power drawn by the oversaturated PGAs effect the power supply, and thus cause the values of the other PGAs in the same row to deviate. The deviation is shown in FIG. 1 as dark regions, as compared to regions where no PGAs are saturated.

SUMMARY

A recognition of the present application is a cause of such artifacts, and a special circuit and technique that avoids these artifacts from occurring.

Embodiments describe a voltage clamping circuit that regulates a current draw of a two-stage amplifier by detecting when that amplifier is oversaturated. The purpose of regulating the current draw for the amplifier is such to maintain the power supply profile across an array of amplifiers; used in a CMOS image sensor.

DETAILED DESCRIPTION

Figure 1:
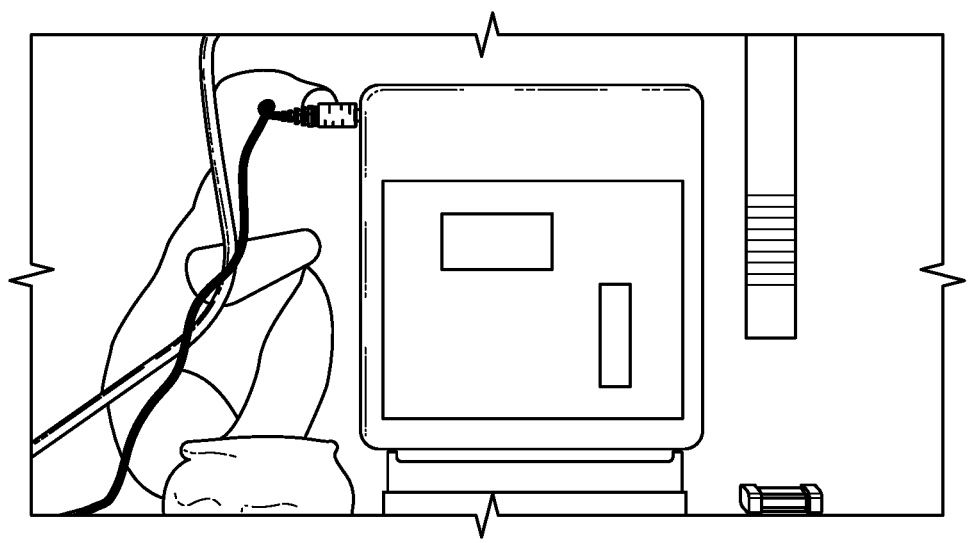
FIG. 1 shows an example image of a ghosting artifact.
Figure 2:
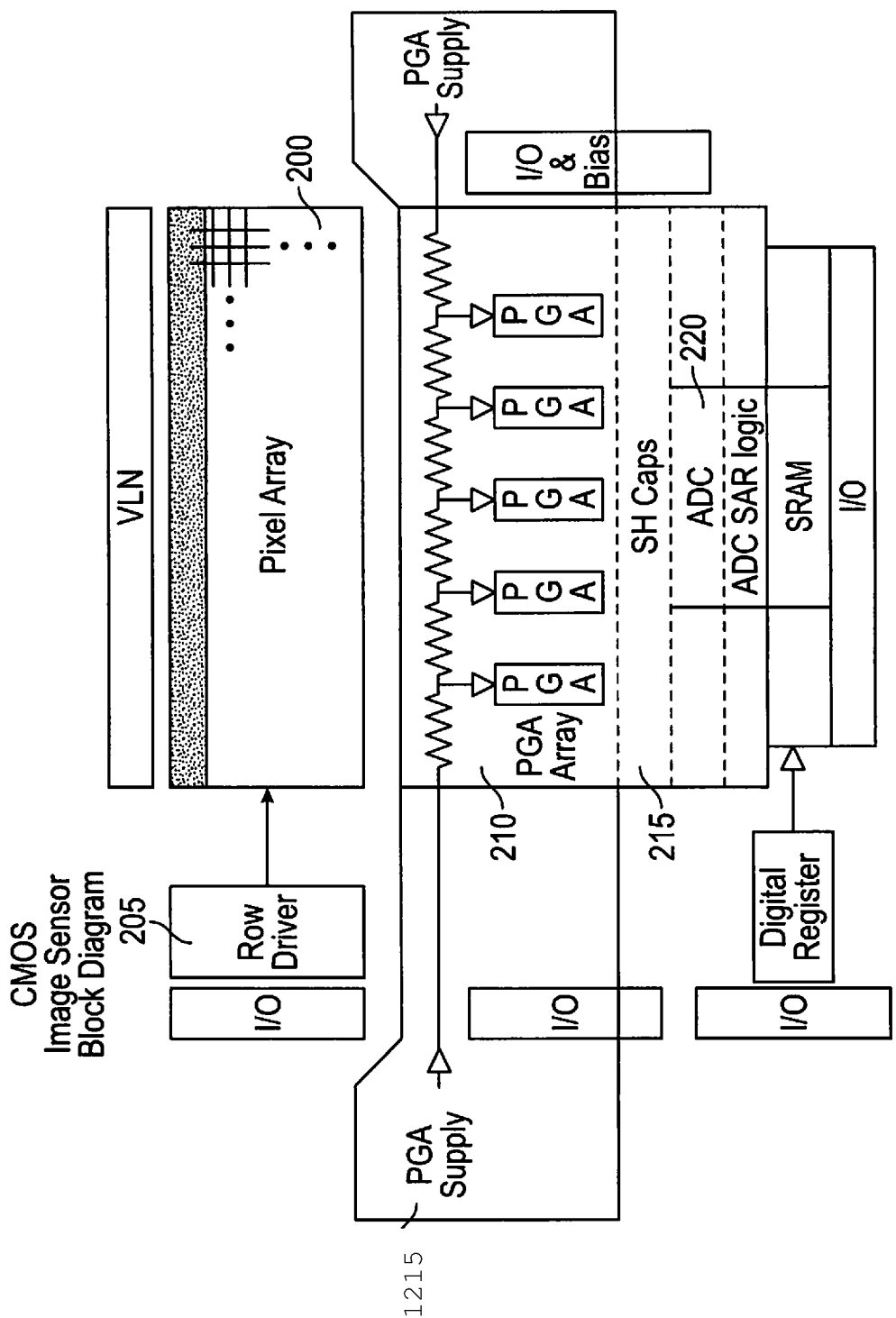
FIG. 2 shows a pixel array of the CMOS image sensor as used according to embodiments.

FIG. 2 illustrates a block diagram of the CMOS image sensor that has a column parallel readout array. The pixel array 200 includes a group of individual pixels forming an image sensor. A row driver 205 drives the pixel array to readout one row at a time into the column parallel programmable gain amplifiers. The PGA array is shown as 210, driven by the PGA supply 1215. The column that is read-out is sampled by the sample and hold capacitors, then A/D converted by an A/D converter 220 and eventually output.

The PGA supply 1215, as described above, inherently changes based on conditions and especially the based on the amount of loading. When the power supply changes, this change can cause artifacts.

The inventors have recognized that the artifacts that are caused are due to the following:

Limited power supply rejection of the circuit.

Power supply resistance across the column array.

The signal being sampled will depend on changes in the power supply voltage and current variation.

A typical output stage of a PGA amplifier has an output node that can swing up a level to as high as the Vsupply rail when the value of the pixel being sampled is oversaturated. When this occurs, the current bias M8_PGA gradually reduces and eventually cuts off depending on the how much power is being consumed.

This change in current draw changes the power supply profile across the PGA array. The amount of current drawn by each element of the PGA array therefore depends on the number of PGA's that are in the over saturated condition. The inventors found that because this number can vary, the power supply profile correspondingly varies.

According to an embodiment, a circuit is described which maintains the same power supply profile across the array regardless of the scene being imaged, by preventing oversaturated PGAs from effecting the power supply. To do so, an embodiment uses a circuit that detects when the PGA is in the oversaturated condition, and the circuit regulates the current draw of that amplifier to maintain a constant current to that amplifier.

Figure 3:
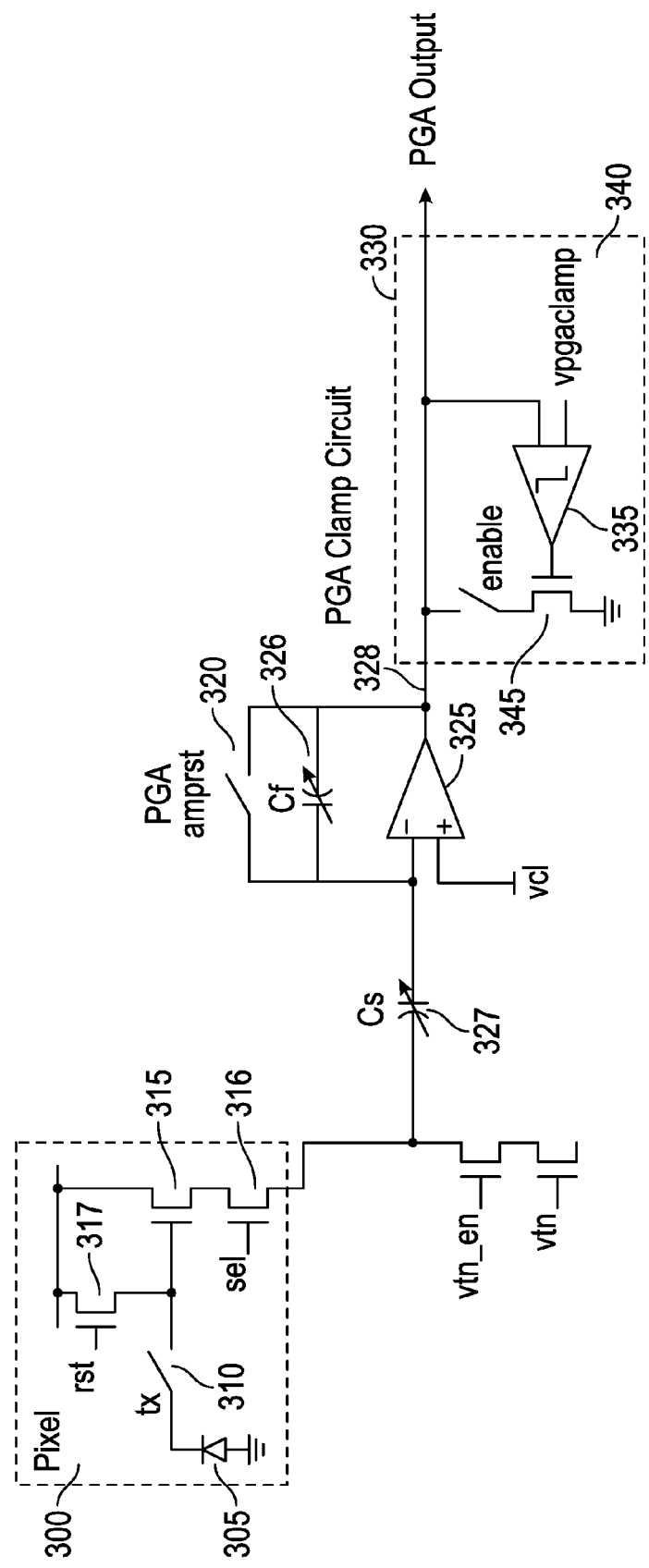
FIG. 3 shows a block diagram of a clamp circuit according to embodiments is used with the image sensor readout.

FIG. 3 shows a block diagram of a typical image sensor column readout circuit with a PGA. The pixel 300 is formed of a photosensor 305 that is connected selectively by a selectable switch to a source follower 315. A row select transistor 316 selects when the output is produced. There is also a reset transistor 317 that resets the pixel.

The PGA 320 is shown as including an amplifier 325 with a variable capacitance 326 in the feedback between the output and input of the amplifier, and another variable capacitance 327 in the input. The ratio between the capacitances of 326 and 327 can be varied to change the amplification rate in the charge domain.

A PGA clamp circuit 330 is attached to the output of the PGA circuit 320. The PGA clamp circuit uses a comparator 335 which compares the output signal 328 from the PGA amplifier with a reference 340 called PGA clamp. This reference represents the value beyond which or above which the output will be considered to be oversaturated. A current mirror 345 is turned on by the output of the comparator 335. When enabled, the current mirror provides a current bias to regulate the supply. This prevents the output from clamping, by substituting the current mirrored output for the other normal output.

Figure 4:
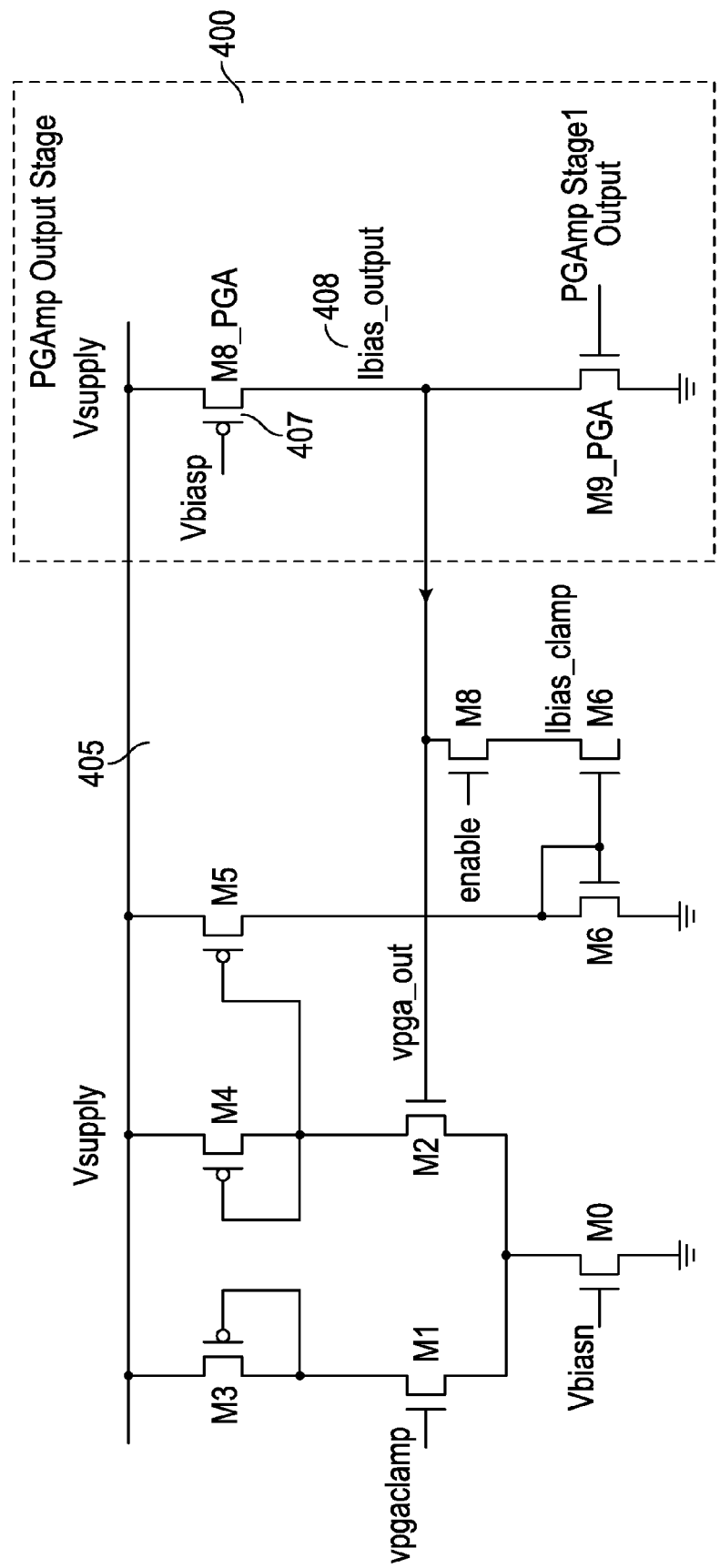
FIG. 4 shows details of the clamp circuit that is used.

FIG. 4 shows an implementation of the PGA clamp circuit with the output stage of the PGA Amplifier. The amplifier output stage is shown as 400, where a supply voltage 405 is driven by the bias level 407 to create a bias output 408.

The comparator 335 is formed of M0, M1, M2, M3 and M4. When the comparator detects that the PGA output has exceeded the reference voltage shown as VPGA clamp, it steers a matching current thru M5, M6, and M7 to limit the PGA output swing and maintain the current draw thru Vsupply.

M8 is used only to enable or disable the PGA clamp circuit. The current biases, Vbiasn and Vbiasp are mirrored from the same current seed to match the currents (M7, Ibias_clamp) and (M8_PGA, Ibias_output).

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of circuits can be controlled in this way.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An image sensor array, comprising:
a plurality of image sensing pixels;
a plurality of programmable gain amplifiers, each of the programmable gain amplifiers connected to receive and amplify an output of said image sensing pixels, in a way such that the plurality of programmable gain amplifiers simultaneously amplifies a plurality of outputs from a plurality of image sensing pixels;
each of said programmable gain amplifiers including a clamp circuit, sensing when an output of the programmable gain amplifier is in an over saturated condition, and responsive to sensing that the output of the programmable gain amplifiers is in the over saturated condition, automatically clamping a bias amount to the programmable gain amplifier, to regulate an amount of current draw of the programmable gain amplifier.

2. The image sensor array as in claim 1, wherein the plurality of programmable gain amplifiers receives an entire row of image sensing pixel outputs at one time.

3. An image sensor array, comprising:
a plurality of image sensing pixels;
a plurality of individual amplifiers, each of the amplifiers connected to an image sensing pixel to amplify an output of the image sensing pixel;
a power supply, which commonly provides power for the plurality of individual amplifiers,
each of the plurality of individual amplifiers including a sensor that senses when the amplifiers are drawing an amount of current that indicates that the amplifier is in an over saturated condition and each of the amplifiers produces a clamp signal indicative of the amplifier being in the over saturated condition; and
a power supply clamp circuit, that operates responsive to said clamp signal, to regulate an amount of power drawn by said amplifier.

* * * * *